US006177057B1

(12) United States Patent
Purdy

(10) Patent No.: US 6,177,057 B1
(45) Date of Patent: Jan. 23, 2001

(54) PROCESS FOR PREPARING BULK CUBIC GALLIUM NITRIDE

(75) Inventor: Andrew P. Purdy, Alexandria, VA (US)

(73) Assignee: The United States of America as represented by the Secretary of the Navy, Washington, DC (US)

(*) Notice: Under 35 U.S.C. 154(b), the term of this patent shall be extended for 0 days.

(21) Appl. No.: 09/252,592

(22) Filed: Feb. 9, 1999

(51) Int. Cl.[7] .................................................. C01B 21/06
(52) U.S. Cl. ............................................................ 423/409
(58) Field of Search ................... 423/409; 148/DIG. 113; 23/295 R

(56) References Cited

U.S. PATENT DOCUMENTS 4,985,742 * 1/1991 Pankove ................................. 357/34
5,834,379 * 11/1998 Shealy ................................... 438/767

OTHER PUBLICATIONS

Marinace J.C., "Synthesis of gallium nitride from ammonium chloride and gallium" IBM Technical Disclosure Bulletin vol. 15 No. 5. p. 1697, Oct. 1972.*

Purdy, A. P. "Ammonothermal Synthesis of Cubic Gallium Nitride", Chem. Mater. 11 pages 1648–1651, 1999.*

* cited by examiner

Primary Examiner—Steven P. Griffin
Assistant Examiner—Maribel Medina
(74) Attorney, Agent, or Firm—John J. Karasek; George A. Kap

(57) ABSTRACT

Bulk cubic gallium nitride is made by charging into a reaction vessel to a fill of 25–95% having a temperature difference between its ends of at least 1° C. a gallium precursor, sufficient amount of an acid mineralizer to form product zinc blende gallium nitride, and sufficient amount of ammonia to at least solubilize the precursor; sealing the reaction vessel; heating contents of the reaction vessel to at least 150° C. while autogenously pressurizing contents of the reaction vessel to at least 500 psi for a duration sufficient to form the product zinc blend gallium nitride; cooling contents of the reaction vessel; and removing from the reaction vessel the product zinc blende gallium nitride.

18 Claims, 1 Drawing Sheet

PROCESS FOR PREPARING BULK CUBIC GALLIUM NITRIDE

BACKGROUND OF THE INVENTION

1. Field of the Invention

This invention pertains to bulk preparation of crystalline cubic or zinc blende form of gallium nitride.

2. Background Art

Gallium nitride has been considered a promising material for semicondutor devices since about 1970, especially for the development of diodes for emitting blue light and ultraviolet light. Gallium nitride is a candidate material for optoelectrical applications at such photon energies because it forms a continuous alloy systems InGaN and AlGaN. Other advantageous properties for this material include high mechanical and thermal stability, large piezoelectric constants and the possibility of passivation by forming thin layers of $Ga_2O_3$ with a bandgap of 4.2 eV. The spontaneous and piezoelectric polarization in wurtzite materials and the high electron drift velocity of $2\times10^5$ m/s can be used to fabricate high power transistors based on AlGaN/GaN heterostructures. For epitaxial growth of gallium nitride by the non-bulk procedure of molecular beam epitaxy it is necessary to supply nitrogen as a molecular beam. Although epitaxial growth of gallium nitride on sapphire and silicon substrates by gas-source molecular beam epitaxy using ammonia has been reported, gallium nitride does not grow on gallium arsenide when ammonia is used, and the nitridation of gallium arsenide surfaces by more active nitrogen sources is suggested for epitaxial growth of gallium nitride on gallium aresnide.

Growth of gallium nitride on gallium arsenide (001) and on gallium arsenide (111) substrates by gas-source molecular beam epitaxy using dimethylhydrazine, as a nitrogen source, produces gallium nitride of different crystal structures. Hexagonal gallium nitride usually exhibits a characteristic (0002) diffraction in x-ray diffraction which corresponds to the diffraction angle $2\theta$ of 34.7°. For epilayers on gallium arsenide (001), only a broad peak is observed at $2\theta$ of 40.0°. Any peak attributable to hexagonal gallium nitride is not observed. Assuming the zinc-blende structure to have the same band length as the wurtzite structure, the peak at $2\theta$ of 40.0° is assigned to (002) diffractions of the cubic latice. For epilayers on gallium arsenide (111) substrates, a sharp peak is observed at $2\theta$ of 34.3.

For the growth of electronic devices it is usually advantageous to have a native substrate in order to eliminate any mismatch between expansion coefficients and crystal lattices. Bulk synthesis of gallium nitride in the normal hexagonal form has been known for many years. Crystals of hexagonal gallium nitride have been grown from the vapor phase at high pressure and temperature, in liquid flux melts, and in supercritical anmmonia using basic mineralizers. Such crystals can be cut up to make native substrates for electronic device growth. However, until this invention, the synthesis of cubic gallium nitride crystals in bulk form had not been reported.

OBJECTS AND BRIEF SUMMARY OF THE INVENTION

It is an object of this invention to produce gallium nitride in cubic crystal form by a bulk process.

It is another object of this invention to produce cubic gallium nitride in the form of large crystals that can be seen with a naked eye. It is another object of this invention to produce white cubic gallium nitride that has higher band gap than hexagonal gallium nitride.

These and other objects of this invention can be attained by reacting gallium metal or gallium imide, or other gallium compounds with an ammonium halide in a nitriding solvent at super critical conditions.

BRIEF DESCRIPTION OF THE DRAWING

The FIGURE is a schematic illustration of a commercially available LECO HR-1B hydrothermal system containing a quartz ampoule that is sealed when carrying the reaction disposed in the ampoule counter pressured with water.

DETAILED DESCRIPTION OF THE INVENTION

Figure 1:
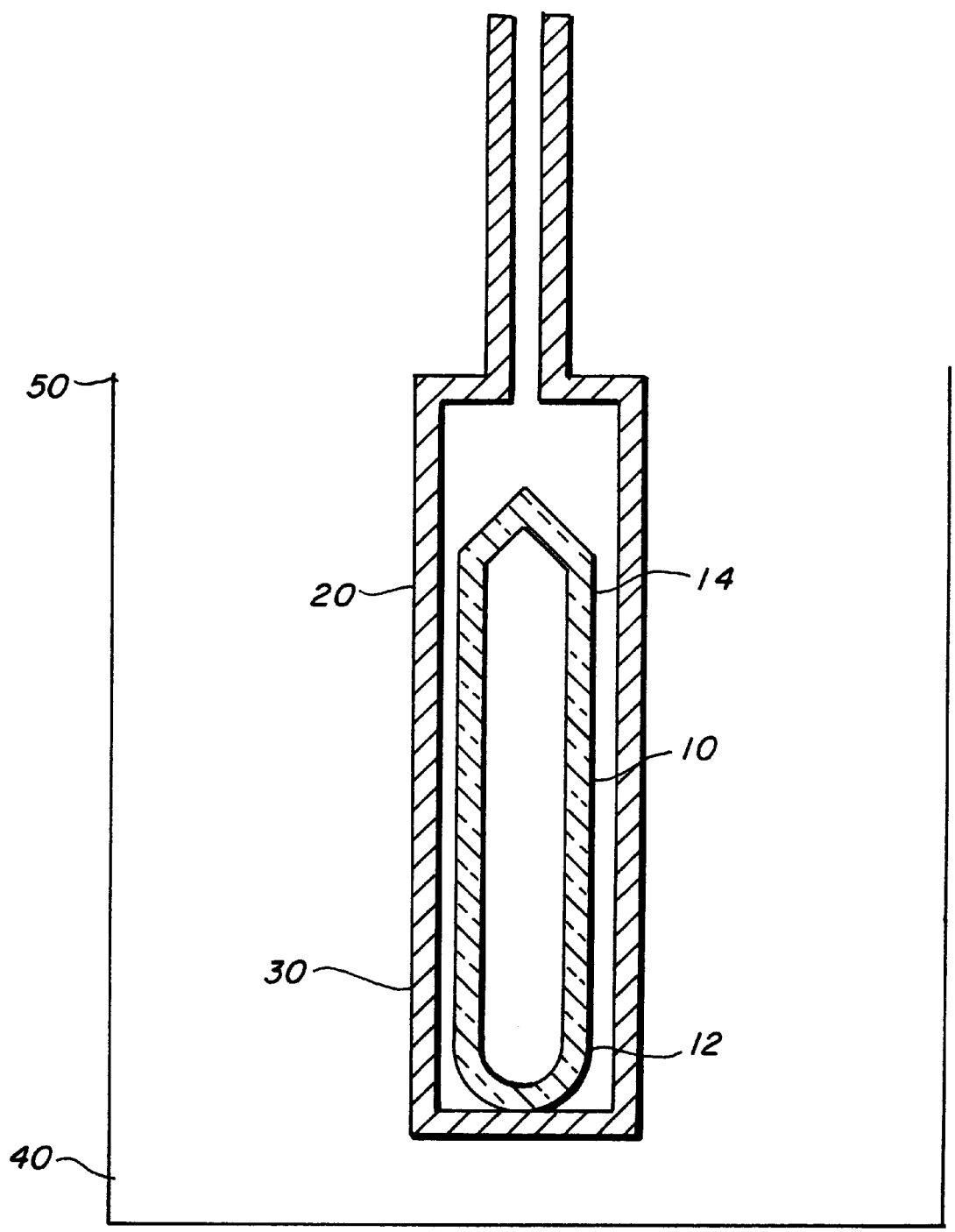

The bulk synthesis reaction described herein produces polycrystalline and single crystal gallium nitride in the cubic or zinc blende form. To produce crystals of cubic gallium nitride, a gallium precursor selected from gallium metal, gallium halide, gallium imide and cyclotrigallazane is reacted with an ammounium halide in a solvent at high temperature and pressure. In the case of the gallium halide precursor, ammonium halide is generated in situ by the reaction with ammonia and no added ammonium halide is required. The zinc blende gallium nitride is stable at room temperature and up to above 900° C. when it changes to the hexagonal form.

In the one-step process, the reaction is conducted in a nitriding solvent at high temperature and pressure. The reaction temperature is above about 400° C., typically 430–550° C., and especially 440–500° C. in order to grow crystals of the cubic form of gallium nitride.

This reaction can also be carried out in a two-step process by reacting or pre-reacting the reactants first at a lower temperature to obtain powders containing cubic gallium nitride and then completing the reaction at a higher temperature to effect the solvothermal transport of cubic gallium nitride. Solvothermal transport involves solubilization in the lower or the hotter zone and recrystallization of crystalline gallium nitride on the inner surface of the reaction vessel in the upper or the cooler zone. The objective of the first step is to carry out the reaction and form cubic gallium nitride in microcrystal form at bottom of the reaction vessel. The objective of the second step is the solvothermal transport of the gallium nitride residing in the bottom portion of the reaction vessel to about the middle to the upper portion of the reaction vessel.

In the two-step process, the first step can be carried out at 150–420° C., typically at 250–400° C., for a duration of ½ to 50 hours, typically 1–24 hours. The second step can be carried out 430–550° C., typically at 440–500° C. in ½–50 hours, typically 1–24 hours. Duration and the form of gallium nitride produced depends not only on reaction temperature but also on reactants employed and other parameters.

The pressure in both processes is typically autogenous and is at least about 500 psi, typically 10,000–60,000 psi. A system using pressure pumps can be used to gain precise control of the pressure. High pressure is typically used for the solvothermal transport.

The nitriding solvent is typically anhydrous ammonia, but can also be hydrazine or a mixture of ammonia and hydrazine. The nitriding solvent typically solubilizes the gallium precursor.

Principal reactants are a gallium precursor and an acidic mineralizer. The gallium precursor may or may not be soluble in the solvent. If gallium metal is used, the metal is a solid and can be in chunk form or particulate. If a gallium imide is used, it may be obtained, for example, by reacting a mole of gallium halide, such as gallium triiodide, with 2.7–3.1 moles of an amide, such as an alkali metal amide or potassium amide specifically, in a solvent, such as ammonia, at a tempertaure of from (−) 76° C. to room temperature or about 30° C. in presence of a small amount of under 1%, by weight of the reactants, of a silicone grease that is a mixture of about 10% by weight silica gel and about 90% by weight silicone oil. The reaction product of silicon grease or silicone oil and potassium amide can be used as an alternative to adding silicon grease. The product of this reaction is a gallium imide iodide that contains some unidentified product with silicone grease. The reaction of the gallium precursor with the acid mineralizer, at the reaction conditions, yields the cubic gallium nitride. Cubic gallium nitride can also be made in one reaction, isolated, and utilized in place of the gallium precursor to recrystallize the cubic gallium nitride.

Acidic mineralizer is any substance that is soluble in solvent ammonia and which produces a hydrogen, or $NH_4^+$ ion. It reacts with the gallium precursor to make the precursor soluble in the ammonia solvent and acts as a transport in the formation of the crystal material. It is typically in a solid powder form but it can be used in any form, such as a liquid.

Acidic mineralizers suitable herein typically include any ammonium salt ($NH_4X$) soluble in liquid ammonia, where X is a halogen or any negative ion the ammonium salt of which does not engage in any side reaction at reaction conditions. Most ammonium salts are easily solubilized in ammonia solvent since they form hydrogen bonds with the solvent. Suitable acid mineralizers in this group include ammonium iodide, ammonium bromide and ammonium chloride. Acidic mineralizers suitable herein also include hydrazinium halides, alkylammonium halides having the formula $R_xNH_{4-x}Y$, where Y is halide and x is 1–3. A suitable acid mineralizer in this group is dimethylanmonium chloride with x being 2. Also suitable herein are acid mineralizers having the formula $R_3PHX$, where X is a halide. A suitable acid mineralizer in this group is triphenylphosphonium chloride.

Amount of the acid mineralizer is typically from a trace amount to 10.0, such as 0.001–10.0 and more typically 0.05–0.5 mole per mole of the precursor. If less than 0.001 mole per mole of an acidic mineralizer is used, the acid mineralizer is typically ineffective; if more than about 10.0 mole per mole of an acidic mineralizer is used, it may consume the precursor or give very low product yields. Since some acidic mineralizers are more effective than others, less of the more effective acidic mineralizer need be used. A small amount of mineralizer can mean a long reaction time before product is obtained, and can dramitically lower the yield of cubic GaN for some reactions. However, low molar levels of mineralizer can produce less contamination of the products and thus improved quality, particularly for the recrystallization of pre-made cubic GaN. Growth rates of the product crystal materials can be increased by using higher molar levels of the precursors and acidic mineralizers. It should be remembered, however, that better quality crystal materials are produced at slower growth rates.

The solvent that is used herein is anhydrous ammonia which is introduced into the reaction vessel under conditions so that it is a liquid. Sufficient ammonia is used to obtain a fill factor in the reaction vessel typically 25–95%, more typically 50–85%, based on volume of the free space in the reaction vessel above the reactants. Fill factors below about 25% do not produce product because there is an insufficient amount of ammonia in the reaction vessel to act as a solvent. Where fill factor exceeds about 95%, excessive pressures are produced that could rupture the pressure vessel. The fill factor establishes the pressure in the reaction vessel after it is sealed and heated. The dielectric constant, and therefore, the solvent properties of supercritical ammonia are highly dependent on pressure. The product will not be formed if an appropriate fill factor is not used. Water as a solvent does not work because it reacts with the precursors and/or product to yield hydroxides and oxides.

If the reaction vessel is made of or contains quartz, ammonium fluoride acid mineralizer is not used since it can dissolve quartz. Furthermore, if ammonium fluoride is used as the acidic mineralizer, intermediate formation of gallium fluoride would be problematic since gallium fluoride is insoluble in ammonia.

The reaction vessel is typically a quartz glass tube which is sealed by application of a torch flame at the end opposite from where the contents of the tube reside. If the reaction vessel is not made of glass, valve closure or the like can be used to seal the vessel contents from the atmosphere.

After sealing the vessel contents, the reaction vessel, with the contents therein, is heated to a temperature above 150° C., typically 4 30–550° C. A quartz reaction vessel is typically used since acids attack steel at high temperature and pressure. Since the reaction vessel is closed-off, heating creates high autogenous pressure therein, on the order of 30,000 psi which can burst the pressure vessel if precaution is not taken to provide counter pressure on the outside of the reaction vessel.

Explosion of the reaction vessel can be overcome by using a glass ampoule, placing the ampoule in a pressure vessel and introducing water, or some other pressurizing fluid, into the pressure vessel around the ampoule. Water is then pressurized to provide counter pressure around the ampoule when the pressure vessel is placed in a furnace and the contents thereof are heated. Typically, the counter pressure is sufficient to prevent explosion of the ampoule. The initial counter pressure at room temperature is provided by pressurizing water to a pressure on the order of 10,000 psi. The counter pressure around the reaction vessel rises as water around the ampoule and the ampoule contents are heated. Counter pressure that is too high can result in implosion of the reaction vessel. The initial counterpressure is highly dependent on the size of the ampoule and the volume of the autoclave it is heated in.

On the basis of the precursor(s) and mineralizer(s) used, the fill factor, and duration, the formation of microcrystalline powders of cubic gallium nitride starts at above about 150° C. and recrystallization of cubic gallium nitride and deposition on the walls of the tube begins about 430° C.

Duration of the heating step should be long enough to produce cubic galium nitride. This duration should be less than 3 months, typically up to a week or ½–50 hours, and more typically 1–24 hours, during which time the cubic gallium nitride deposits at the middle to upper portion of the reaction vessel. What takes place in the reaction vessel during heating is a solvothermal reaction that is conducted at or above the critical point of the solvent.

The reaction vessel must have a temperature difference between its upper portion and its lower portion in order to grow at least some of the single crystal materials pursuant to the process disclosed herein. The temperature difference between top and bottom of the reaction vessel, for a vertically disposed reaction vessel while in the fuirnace, was estimated to be 50–150° C., but it can be substantially lower or higher. The temperature difference should be sufficient to form cubic gallium nitride in the reaction vessel and should be at least about 1° C. Small temperature differences should give slower growth rates and thus may allow more precise control over the crystal growth process. Using the pressure apparatus of The FIGURE or a similar apparatus, lower temperature is normally at the upper portion of the reaction vessel whereas higher temperature is normally at its lower portion. For a horizontally disposed reaction vessel, or a reaction vessel disposed at some intermediate position, the temperature difference is from one end to the opposite end of the reaction vessel. In terms of temperature gradient, it should be at least a fraction of 2 Centigrade degree per centimeter to 50 Centigrade degrees per centimeter, more typically 1–10° C./cm of the reaction vessel length.

The heating step is followed by cooling to about room temperature over a period of many hours, typically 1–10 hours. Once sufficiently cooled, the reaction vessel is opened and the crystal materials are extracted. If an ampoule is used as the reaction vessel disposed within a pressure vessel where counter pressure is provided by initially pressurized and subsequently heated water which becomes supercritical, the ampoule is removed from the pressure vessel following cooling, opened by breaking and the crystal materials are extracted and washed, if needed.

Alternatives to using a quartz ampoule include such methods as a reactor fabricated from corrosion resistant alloys and directly pressurized with ammonia, or a metal reactor lined with a corrosion resistant material such as quartz, teflon or other ceramics. Other alternatives can also be used.

Cubic gallium nitride product obtained with the process disclosed herein in the form of single crystals on the order of 10–40 micrometers in size can be produced by the process described and claimed herein. The use of seed crystals, mechanical baffles or screens to prevent the mechanical transport of particles, and an apparatus that allows a very precise control of the temperature gradient would be expected to allow much larger crystals, on the order of milimeters in size to be grown. Using larger sized reactors, such as would be used industrially, could result in even larger crystals. Pattern of spots obtained by x-ray diffraction can be used to distinguish single crystal materials from polycrystalline materials. Single crystals of solid solutions, i.e., solid alloys of two or more compounds with the same crystal structure, can be grown.

Referring to specific embodiments of the process disclosed herein, microcrystalline powders containing crystals of cubic gallium nitride can be obtained at temperatures above 150° C. and single crystals can be grown in the middle to upper portions of quartz tube reaction vessel at temperatures above 400° C.

In the case of Ga metal precursor and ammonium iodide mineralizer, at temperatures below about 430° C., all of the GaN product remains at the bottom of the tube (reaction vessel) as a fine, off-white to tan powder. In general, the ratio of well crystallized h-GaN to c-GaN present increases sharply at temperature from 260–430° C., with the lower temperature product consisting mostly of c-GaN and the higher temperature product being mostly h-GaN. Unlike cyclotrigallazane, which reacts rapidly at a temperature as low as about 200° C., Ga metal reacts slowly at 300° C., as some unreacted Ga is left in the tube even after 1000 minutes of reaction time. At about 440° C., some of the solid product is transported solvothermally, and polycrystalline material grows on the wall around the middle of the tube. The composition and amount of deposited material is a function of many variables including the amount of $NH_4I$ added, the final temperature, and how long the reaction is held at lower intermediate temperatures. When a tube containing 30 mg Ga and ½ molar equivalent $NH_4I$ is heated to 500° C. as rapidly as the apparatus is capable of, a thick orange deposit of c-GaN grows. If the Ga is first converted to a mixture of h-GaN and c-GaN by heating to 350–400° C. and then reheated to above 440° C., small clusters of c-GaN crystals representing only a small fraction of the total material grow in the middle of the tube. Apparently, transport and recrystallization of c-GaN occurs much more rapidly than h-GaN under ammonoacidic conditions. However, when Ga is converted to GaN at a temperature of 305° C. and the tube is reheated to 455° C., a thick grey deposit of h-GaN crystals grows instead. One explanation for this result is that the h-GaN crystals grow from some amorphous or poorly crystallized intermediate that forms at temperatures below 350° C. The formation of cubic GaN is favored by low concentrations of reactants and h-GaN is favored by high concentrations of reactants.

Gallium triiodide ($GaI_3$) is moderately soluble in $NH_3$ at room temperature, but reacts around 415° C. to form GaN. Lower temperatures and low concentrations favor the formation of c-GaN powder in the bottom of the tube. Deposition along the walls is favored by higher temperatures, and the yellow to orange color of the deposited c-GaN deepens as the reaction temperature is increased.

Gallium diiodide ($GaI_2$) disproportionates, depositing Ga metal as soon as its mixture with ammonia is warmed to room temperature. As with Ga metal, the products of ammonolysis are dependent on both final temperature and how long the reaction is held at intermediate temperatures. With a 2-stage heating profile of 355° C. then 455° C. for 1000 min each, h-GaN is transported exclusively, and long needles of h-GaN are grown on the walls in the middle of the tube. Rapid heating to 440° C. produces a different result—the transported material is deposited in two bands. The lower grey band is primarily h-GaN and the upper orange band is primarily c-GaN. Non-condensible gases (presumably hydrogen) are produced, as expected, whenever low oxidation state Ga reacts with $NH_3$.

Apparatus schematically illustrated in The FIGURE can be used to carry out the process described herein. The apparatus is shown in The FIGURE where 10 is the reaction vessel or a quartz tube with bottom 12 and top 14. Tube 10 is disposed vertically and generally centrally within steel pressure vessel 20 having wall thickness of 10 mm and internal diameter of 8 mm. Between tube 10 and pressure vessel 20 is water. The apparatus is also known as LECO HR-1B-2 Hydrothermal System and is commercially available.

Having described the invention, the following examples are given as particular embodiments thereof and to demonstrate the practice and advantages thereof. It is understood that the examples are given by way of illustration and are not intended to limit the specification or the claims in any manner.

EXAMPLE 1

This example demonstrates preparation of the precursor gallium imide that can be subsequently reacted with an acid mineralizer to form cubic gallium nitride.

1(a). In a 100 ml quartz H-tube with an insulated filter arm, 1.29 g or 23.4 mmol of $KNH_2$ was added to a solution of 3.50 g or 7.78 mmol $GaI_3$ in 40 ml anhydrous $NH_3$ containing no more than 10 mg of silicone grease. The silicone grease was a mixture of 9% by weight silica gel and 91% by weight silicone oil. Pressure in the system was regulated at 1 atmosphere by a bubbler which controlled the temperature of the $NH_3$ at −33° C. The $KNH_2$ had been stored in dri-lab for several years and was slightly yellow which indicated some oxidation had taken place. The reaction mixture was stirred for 15 minutes and then filtered. The white solid on the filter was washed 3 times with recondensed $NH_3$, and then the $NH_3$ was vented and the product was dried in vacuo. 98 g of the product Ga-N-H-I (#1) was isolated. Analysis of the product found 53.95% Ga, 15.54% N, 1.26% H, and 24.88% I. A large peak in the infrared spectrum at 1091 $cm^{-1}$ is indicative of the reaction with the silicone grease.

1(b). Using the same procedure as above with freshly prepared 1.07 g or 19.4 mmol $KNH_2$ and 2.88 g or 6.39 mmol $GaI_3$ devoid of the silicone grease, 0.606 g of a white product Ga-N-H-I (#2) was isolated but the 1091 $cm^{-1}$ peak was not present.

1(c). Using the same procedure as above with 0.38 g or 6.9 mmol freshly prepared $KNH_2$, 1.00 g or 2.2 mmol $GaI_3$ containing 17 mg produced 213 mg of a white solid product (#3) with a very strong peak at 1091 $cm^{-1}$ in the infrared spectrum.

EXAMPLE 2

This example demonstrates preparation of cubic or zinc blende gallium nitride by reacting a gallium precursor with an acid mineralizer in solvent ammonia pursuant to the following procedure: 19 mmol of anhydrous ammonia was condensed into a quartz tube that was 17 mm long with 3 mm outside diameter and 5 mm inside diameter containing the rectants at −196° C. The tube was then sealed with a hydrogen-oxygen flame at about 14 mm from the bottom of the tube. The tube was filled about ⅔ full at room temperature and loaded into a MR-114R pressure vessel which was attached to a Leco HR-1B hydrothermal system. The vessel was pressurized to 10,000 psi with distilled water and the furnace was set to the desired temperature for 1000 minutes, unless otherwise noted. Typically, the temperature measured in the thermowell near the bottom of the pressure vessel stabilized at 50° C. less than the furnace temperature. After the reaction cooled to room temperature, the pressure was relieved and the tube removed. Most of the liquid was frozen with liquid nitrogen and the tube was opened. In other reactions where deposits occurred on the walls of the tube, those deposits were removed with a stiff wire. Products were washed several times with ethanol, then acetone, and then allowed to dry.

2(a). Reactants: Ga metal (20 mg, 0.29 mmol), $NH_4I$ (20 mg, 0.14 mmol), and $NH_3$. Autoclave was heated to 497° C. as rapidly as possible. An orange deposit of c-GaN formed on the walls in the middle of the tube.

2(b). Reactants: Ga (19 mg, 0.27 mmol), $NH_4I$ (18 mg, 0.12 mmol), and NH3. The temperature was held at 350° C. for 1000 minutes then raised to 455° C. for 1000 minutes. Clusters of orange microcrystals of c-GaN (microns in size) formed in the middle of the tube.

2(c). Reactants: Ga (31 mg, 0.44 mmol), $NH_4I$ (30 mg, 0.20 mmol), and NH3. The temperature was held at 306° C. for 40 hours, after which all Ga had reacted to form an off-white powder on bottom of tube. The tube was reheated to 455° C. for 1000 minutes which produced a thick grey deposit intermixed with orange material in the middle of the tube. Deposit was mostly h-GaN and contained some c-GaN.

2(d). Reactants: $GaI_2$ (103 mg, 0.32 mmol) and NH3. The tube was heated to 350° C. for 1000 minutes affording a tan precipitate. The tube was reheated to 460° C. for 49 hours resulting in a thick, grey deposit of h-GaN in the middle of the tube. Most of the h-GaN crystals were 20–50 micrometers in length but h-GaN crystals of up to several hundred microns in length were present.

2(e). Reactants: $GaI_3$ (80 mg, 0.18 mmol) and NH3 (mg, 19 mmol); 416° C. (1000 min.) Result: orange crystalline c-GaN on bottom of tube.

2(f). Reactants: $GaI_3$ (273 mg, 0.61 mmol) and $NH_3$; 466° C. (1000 minutes). Result: grey powder on bottom is mostly h-GaN with some c-GaN; orange deposit at middle of tube is mostly c-GaN with some h-GaN.

2(g). Reactants: Cyclotrigallazane $(H_2GaNH_2)_3$ (35 mg, 0.13 mmol), $NH_4I$ (34 mg, 0.23 mmol), and $NH_3$; 445° C. (1000 minutes). Result: tan powder on bottom of tube, mostly h-GaN and orange deposit (c-GaN) in middle of tube.

2(h). Reactants: Cyclotrigallazane (38 mg, 0.13 mmol), $NH_4I$ (38 mg, 0.26 mmol), and $NH_3$ (% fill); 202° C. (1315 minutes). Result: yellow-tan powder on bottom of tube, shows c-GaN in x-ray powder pattern.

2(i). Reactants: Ga-N-H-I #1 (90 mg), $NH_4I$ (120 mg, 0.83 mmol), and $NH_3$ (65% fill); 500° C. (1000 minutes). Result: orange deposit in middle of tube (c-GaN). Analysis for GaN found: Ga, 82.88% (83.28); N, 16.39% (16.73). Orange powder at bottom of tube was mostly c-GaN with very small amount of h-GaN.

2(j). Reactants: Ga-N-H-I #1 (20 mg), $NH_4I$ (20 mg, 0.14 mmol), $NH_3$ (65% fill); 276° C. (1000 minutes). Result: yellow solid at bottom of tube, has fairly sharp peaks for c-GaN in powder pattern.

2(k). Reactants: Ga-N-H-I #2 (29 mg), $NH_4I$ (29 mg, 0.20 mmol), $NH_3$ (64% fill); 326° C. (1000 minutes). Result: yellow solid at bottom of tube has only broad amorphous peaks in powder pattern.

2(l). Reactants: Ga-N-H-I #3 (31 mg), $NH_4I$ (44 mg, 0.30 mmol), $NH_3$ (58% fill); 374° C. (1000 minutes). Result: orange-yellow solid at bottom of tube. X-ray powder pattern show sharp peaks for c-GaN superimposed over broad c-GaN peaks.

2(n) Reactants: Ga (70 mg, 1.0 mmol) and $NH_4I$ (140 mg, 0.96 mmol), 64% $NH_3$ fill. Tube was rapidly heated to 514° C. for 1000 min. Upon cooling and relieving of counterpressure, the tube burst in the autoclave. Crystals of b-GaN 300 micrometers in length were isolated.

Cubic or zinc blende form of gallium nitride is preferred for certain electronic devices, especially power electronic devices. The preference is based on certain advantageous properties of the zinc blende gallium nitride as compared to hexagonal gallium nitride such as electron mobility, easier doping, band gap, and others. Also, depositing zinc blende gallium nitride on a zinc blende gallium nitride substrate by chemical vapor deposition can be done by true epitaxy.

While presently preferred embodiments have been shown of the novel process, persons skilled in this art will readily appreciate that various additional changes and modifications can be made without departing from the spirit of the invention as defined and differentiated by the following claims.

What I claim is:

1. A process for preparing cubic GaN comprising the steps of (a) charging into a reaction vessel to a fill factor of 25–95% and having a temperature difference between its ends of at least 1° C. a gallium precursor, an acid mineralizer to form product cubic gallium nitride and a nitriding solvent to at least solubilize the precursor;

(b) closing the reaction vessel;

(c) heating contents of the reaction vessel to at least 150° C. while autogenously pressurizing contents of the reaction vessel to at least 500 psi for a duration sufficient to form cubic gallium nitride;

(d) cooling contents of the reaction vessel; and (e) removing from the reaction vessel the product cubic gallium nitride.

2. The process of claim 1 wherein the fill factor is 50–85%, the heating temperature is 430–530° C., autogenous pressure in the reaction vessel is 10,000–60,000 psi, the heating duration is ½–50 hours, and the nitridina solvent is ammonia.

3. The process of claim 2 wherein the heating duration is 2–24 hours, amount of the acid mineralizer is 0.01–0.5 mole per mole of the precursor, and the temperature difference in the reaction vessel is at least 20° C.

4. The process of claim 1 including the steps of heating the reaction vessel contents to 150–420° C. to effect the reaction and then heating the reaction vessel contents to 430–530° C. to effect solvothermal transport of the product.

5. The process of claim 2 wherein amount of the acid mineralizer is 0.05–0.3 mole per mole of the precursor.

6. The process of claim 2 wherein the gallium precursor is selected from the group consisting of gallium, gallium imide, and mixtures thereof; and wherein the acid mineralizer is selected from the group consisting of ammonia-soluble ammonium halides, other ammonia soluble ammonium salts, alkyl ammonium and alkyl phosphonium salts, and mixtures thereof.

7. The process of claim 6 wherein the acid mineralizer is selected from the group consisting of ammonia-soluble ammonium halides; and wherein the gallium imide is prepared by reacting a gallium halide with an amide at a reaction temperature below about 25° C. in a solvent for the gallium halide in the presence of a small amount of a silicone grease.

8. The process of claim 7 wherein the acid mineralizer is selected from the group consisting of ammonium iodide, ammonium bromide, ammonium chloride, and mixtures thereof; the gallium halide is gallium triiodide; the amide is potassium amide; the reaction temperature is from −76° C. to 250° C.; the solvent is ammonia; the process including the step of charging the reaction vessel silicone grease in amount of less than 1%, based on the weight of the reactants and it is a mixture of about 10% silica gel and about 90% silicone oil, on weight basis.

9. The process of claim 6 wherein product cubic gallium nitride is formed at about the middle to the upper portion of the inner surface of the reaction vessel.

10. The process of claim 9 wherein the reaction vessel is elongated and is made of quartz and wherein the process includes the steps of sealing which is accomplished by flame sealing the quartz reaction vessel, positioning the reaction vessel in a pressure vessel vertically in a spaced relationship thereto so that there is space between the reaction vessel and the pressure vessel with a fluid disposed in the space, pressuring the fluid to provide counter pressure on the reaction vessel, and placing the pressure vessel with the reaction vessel therein into a furnace where contents of the reaction vessel are heated and the product is formed in the reaction vessel.

11. The process of claim 10 wherein the fluid is water and where the cooling is effected by removing heat from the furnace and allowing contents of the reaction vessel to cool over a period of 1–10 hours.

12. A process for makinq cubic GaN comprising the steps of (a) charging to an elongated quartz reaction vessel having a temperature difference between its ends of at least 1° C. ammonia solvent, a gallium precursor, and ammonium iodide acid mineralizer in amount of 0.05–0.5 mole per mole of the precursor, the reaction vessel having a fill factor of 25-95%;

(b) sealing the reaction vessel from the atmosphere;

(c) placing the sealed reaction vessel within a pressure vessel in a spaced relationship thereto forming a space therebetween with a fluid disposed in the space;

(d) pressurizing the fluid to impart counter pressure on the reaction vessel;

(e) heating contents of the reaction vessel at 430–530° C. for ½–50 hours by placing the loaded pressure vessel into a furnace whereby contents of the reaction vessel are subjected to high pressure and temperature of 430–530° C. and form product cubic gallium nitride;

(f) cooling contents of the reaction vessel; and (g) removing the product cubic GaN from the reaction vessel.

13. The process of claim 12 wherein the fill factor is 55–85%, wherein the heating duration is 2–24 hours, and wherein amount of the acid mineralizer is 0.05–0.3.

14. The process of claim 13 wherein the heating temperature is 440–500° C.

15. The process of claim 14 wherein the gallium precursor is selected from the group consisting of gallium, gallium imide, and mixtures thereof; the temperature difference in the reaction vessel is at least 20° C.; and the gallium imide is prepared by reacting a gallium halide with an amide at a reaction temperature of −76° C. and +25° C.

16. The process of claim 15 wherein the acid mineralizer is selected from the group consisting of ammonium iodide, ammonium bromide, ammonium chloride, and mixtures thereof; the gallium halide is gallium triiodide; the amide is potassium amide; the reaction temperature is from −76° C. to 250° C.; the solvent is ammonia; the process including the step of charging the reaction vessel silicone grease in amount of less than 1%, based on the weight of the reactants, and it is a mixture of about 10% silica gel and about 90% silicone oil, on weight basis.

17. The process of claim 16 wherein the fluid between the pressure vessel and the reaction vessel is water; and wherein during the heating of the pressure and the reaction vessels, water between the pressure and the reaction vessels and ammonia in the reaction vessel are supercritical fluids.

18. The process of claim 17 wherein the amide is potassium amide; the reaction temperature is from −76° C. to 25° C.; the solvent is ammonia.

* * * * *